United States Patent
DCamp et al.

(10) Patent No.: US 7,482,193 B2
(45) Date of Patent: Jan. 27, 2009

(54) INJECTION-MOLDED PACKAGE FOR MEMS INERTIAL SENSOR

(75) Inventors: Jon B. DCamp, Savage, MN (US); Harlan L. Curtis, Champlin, MN (US)

(73) Assignee: Honeywell International Inc., Morristown, NJ (US)

( * ) Notice: Subject to any disclaimer, the term of this patent is extended or adjusted under 35 U.S.C. 154(b) by 376 days.

(21) Appl. No.: 11/017,521

(22) Filed: Dec. 20, 2004

(65) Prior Publication Data
US 2006/0134825 A1 Jun. 22, 2006

(51) Int. Cl.
*H01L 21/00* (2006.01)

(52) U.S. Cl. .......................... 438/51; 438/112; 438/127

(58) Field of Classification Search ............. 438/48–56, 438/106–127
See application file for complete search history.

(56) References Cited

U.S. PATENT DOCUMENTS

| | | | |
|---|---|---|---|
| 4,720,424 A | 1/1988 | Eickman et al. | |
| 5,818,094 A * | 10/1998 | Matsuo | 257/434 |
| 5,909,915 A | 6/1999 | Okuda | |
| 5,992,233 A | 11/1999 | Clark | |
| 6,220,764 B1 | 4/2001 | Kato et al. | |
| 6,255,739 B1 | 7/2001 | Adachi et al. | |
| 6,469,909 B2 | 10/2002 | Simmons | |
| 6,528,351 B1 * | 3/2003 | Nathan et al. | 438/118 |
| 6,743,656 B2 * | 6/2004 | Orcutt et al. | 438/66 |
| 6,793,209 B1 | 9/2004 | Roberts | |
| 6,804,883 B1 * | 10/2004 | Weiblen et al. | 29/854 |
| 6,936,494 B2 * | 8/2005 | Cheung | 438/55 |
| 2001/0008703 A1 | 7/2001 | Sakata et al. | |
| 2002/0003819 A1 | 1/2002 | Kimura et al. | |
| 2002/0037233 A1 | 3/2002 | Billiet et al. | |
| 2002/0089835 A1 | 7/2002 | Simmons | |
| 2002/0121680 A1 * | 9/2002 | Ahn et al. | 257/666 |
| 2002/0179986 A1 | 12/2002 | Orcutt et al. | |
| 2003/0026081 A1 | 2/2003 | Liu et al. | |

(Continued)

OTHER PUBLICATIONS

International Search Report issued in related International Appln. No. PCT/US2005/045343, international filing date Dec. 15, 2005.

(Continued)

*Primary Examiner*—Savitri Mulpuri
(74) *Attorney, Agent, or Firm*—Black Lowe & Graham PLLC

(57) ABSTRACT

Methods of packaging devices such as MEMS devices are disclosed. An illustrative method of packaging a device in accordance with an illustrative embodiment of the present invention can include the steps of providing a substrate having an device provided therein or thereon, attaching a cap to the substrate and sealing the device within an interior cavity of the capped substrate, inserting the capped substrate into a vacuum chamber and evacuating gasses and/or contaminants contained within the interior cavity, and then injection molding a package about the capped substrate in the vacuum chamber. A number of small-sized openings disposed through the cap can be utilized to create a controlled vacuum pressure within the interior cavity of the device when the device is in the vacuum chamber, prior to injection molding the package about the capped substrate. In some embodiments, an inert gas can be injected into the evacuated interior cavity to create a partial pressure for the inertial sensor, prior to injection molding the package about the capped substrate.

25 Claims, 7 Drawing Sheets

U.S. PATENT DOCUMENTS

| | | |
|---|---|---|
| 2003/0043868 A1 | 3/2003 | Stewart et al. |
| 2003/0045044 A1* | 3/2003 | Dentry et al. ............... 438/200 |
| 2003/0102552 A1 | 6/2003 | Martin et al. |
| 2003/0104651 A1* | 6/2003 | Kim et al. ................... 438/106 |
| 2003/0178718 A1 | 9/2003 | Ehly et al. |
| 2004/0072039 A1* | 4/2004 | Jankowski et al. ............ 429/19 |
| 2004/0087043 A1* | 5/2004 | Lee et al. ....................... 438/6 |
| 2004/0115856 A1* | 6/2004 | Jung et al. .................... 438/50 |
| 2004/0146424 A1 | 7/2004 | Nelles et al. |
| 2004/0166603 A1* | 8/2004 | Carley ......................... 438/52 |
| 2005/0023629 A1* | 2/2005 | Ding et al. .................. 257/414 |
| 2005/0054133 A1* | 3/2005 | Felton et al. ................. 438/50 |
| 2005/0133895 A1* | 6/2005 | Ujiie et al. .................. 257/678 |

OTHER PUBLICATIONS

Japanese Publication No. 11-326037, published Nov. 26, 1999, "Vacuum Package for Infrared Detector and It's Manufacture," (English translation of Patent Abstract enclosed).

* cited by examiner

INJECTION-MOLDED PACKAGE FOR MEMS INERTIAL SENSOR

FIELD

The present invention relates generally to the field of semiconductor manufacturing and microelectromechanical systems (MEMS) and other devices. More specifically, the present invention pertains to the packaging of such MEMS or other devices.

BACKGROUND

Microelectromechanical system (MEMS) devices employ the use of semiconductor fabrication techniques to create microscopic mechanical structures on the surface of a substrate. In the production of MEMS gyroscopes and accelerometers, for example, such fabrication techniques are utilized to create a number of moving structures on the substrate that can be used to sense displacement and/or acceleration in response to movement of the device about an input or "rate" axis. In navigational and communications systems, such moving structures can be used to measure and/or detect slight variations in linear and rotational motion of an object traveling through space. In other applications such as automotive systems, for example, such moving structures can be used in vehicle dynamic control (VDC) systems and antilock braking systems (ABS) to sense changes in vehicle and tire motion.

The packaging of MEMS devices remains a significant hurdle in the fabrication process. Typically, MEMS devices are fabricated by first removing a portion of the substrate surface to form the moving structures of the device, and then bonding the processed substrate to a cap that hermetically seals the structures within an interior cavity. In some designs, for example, the moving structures can be formed on the surface of the substrate using an etching and/or grinding process, and then subsequently attached to the cap using a suitable bonding process such as thermocompression bonding or thermoelectric (e.g. anodic) bonding. Once the substrate is processed and capped, a separate packaging structure is then fabricated and secured about the assembly to protect the contents. In some techniques, a lead frame can be coupled to the substrate to provide a means for electrically connecting the MEMS device to other external components, if desired.

Due to their size and composition, the mechanical structures of many MEMS devices are extremely susceptive to damage in high-G applications, and from particles, moisture or other such contaminants that can become entrained within the interior cavity of the capped substrate. In some cases, the difficulty in accurately regulating the pressure within the interior cavity during the fabrication process may affect the vibration characteristics of the device, reducing its efficacy in detecting subtle changes in motion. The process of separately forming the substrate and package and then connecting the two members together to form the final structure is often expensive and time-consuming, and may require additional steps be performed during fabrication. Moreover, such techniques do not resolve the issues of contaminants introduced within the interior cavity that can cause a reduction in device performance. As such, there is a need for robust packaging solutions for MEMS devices that offer both superior vacuum performance and protection against high-G environments while also providing high volume throughput and low cost.

SUMMARY

The present invention pertains to the packaging of MEMS devices. An illustrative method of packaging a MEMS device can include the steps of providing a substrate having an inertial sensor or other suitable MEMS device(s) thereon or therein, attaching a cap to the substrate and sealing the MEMS device(s) within an interior cavity of the capped substrate, inserting the capped substrate into a vacuum chamber and evacuating gasses and/or other contaminants contained within the interior cavity, and then injection molding a package about the capped substrate. In certain embodiments, a lead frame can be provided to electrically connect the MEMS device contained within the injection-molded package to other external components, if desired. The lead frame can be attached to the capped substrate using a suitable bonding technique such as wire bonding, soldering or thermocompression bonding, as desired.

A number of small-sized openings formed through the cap can be utilized to create a controlled vacuum pressure within the interior cavity of the capped substrate. The openings can be sized sufficiently small to prevent particulates, injection molding material, and/or other matter from entering the interior cavity during injection molding. During fabrication, the small-sized openings permit the evacuation of gasses and/or contaminants contained within the interior cavity, allowing a controlled vacuum pressure to be created within the interior cavity adjacent the MEMS device. In some embodiments, the small-sized openings can be further used to inject an inert gas into the interior cavity to form a partial reference pressure adjacent the MEMS device, if desired. Alternatively, and in other embodiments, the vacuum pressure and/or inert gas can be created within the interior cavity as the cap is attached to the substrate, obviating the need for the micron-sized openings.

The injection molding process can be performed under vacuum pressure to create a package that hermetically seals the MEMS device within the interior cavity. In some embodiments, a plastic injection molding process can be utilized to form a plastic package about the capped substrate and/or lead frame. In other embodiments, a metal injection molding (MIM) or ceramic injection molding (CIM) process can be utilized to form a metal or ceramic package about the capped substrate and lead frame.

DETAILED DESCRIPTION

Figure 1A:
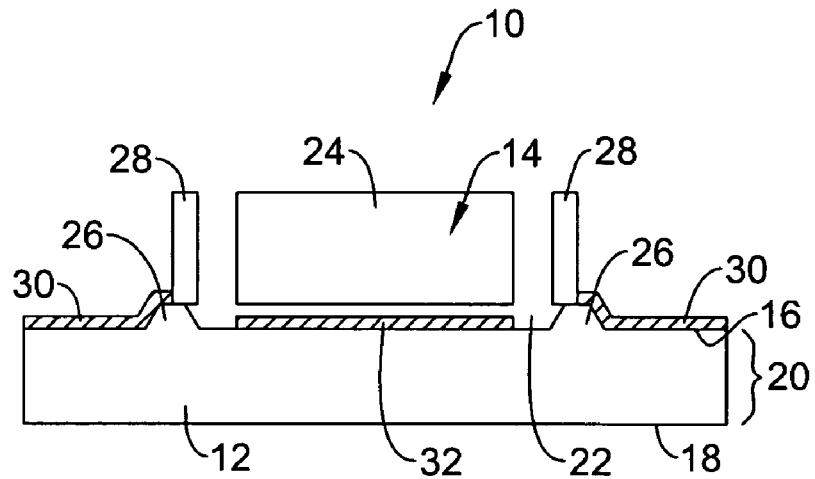
FIGS. 1A-1F are schematic views showing an illustrative method of packaging a MEMS device in accordance with an exemplary embodiment of the present invention.

The following description should be read with reference to the drawings, in which like elements in different drawings are numbered in like fashion. The drawings, which are not necessarily to scale, depict selected embodiments and are not intended to limit the scope of the invention. Although examples of construction, dimensions, and materials are illustrated for the various elements, those skilled in the art will recognize that many of the examples provided have suitable alternatives that may be utilized. While the fabrication of MEMS inertial sensors is specifically discussed, it should be understood that the fabrication steps and structures described herein can be utilized in the packaging of other types of MEMS devices such as electrostatic actuators, optical lenses, RF switches, relay switches, and/or any other suitable device (MEMS or not), as desired.

Referring now to FIGS. 1A-1F, an illustrative method of packaging a MEMS device in accordance with an exemplary embodiment of the present invention will now. be described. The method, represented generally by reference number 10, may begin in FIG. 1A with the step of providing a substrate 12 having a MEMS device 14 formed thereon. The substrate 12 may include, for example, a thin wafer of quartz, silicon, gallium arsenide, germanium, glass, or other suitable substrate material that can be etched and/or otherwise processed to form the various components of the MEMS device 14. In one illustrative embodiment, for example, the substrate 12 may be processed to form a micromachined MEMS inertial sensor such as a gyroscope, which can include a number of freely disposed structures thereon that can be used to detect and measure inertial motion of an object by measuring Coriolis forces exerted on an oscillating proof mass or other such structure. It should be understood, however, that other types of MEMS or other devices (e.g. accelerometers, electrostatic actuators, optical lenses, RF switches, relay switches, etc.) can be formed on or in the substrate 12, as desired.

The processed substrate 12 may have a first side 16, a second side 18, and a thickness 20 extending between the first and second sides 16, 18. The various moving components 24 of the inertial sensor 14 may be freely suspended above a recessed cavity 22 etched within the first side 16 of the substrate 12. A number of mesas 26 extending upwardly from the first side 16 of the substrate 12, in turn, can be configured to support various stationary components 28 of the MEMS device 14. In those embodiments in which the MEMS device 14 includes a gyroscope or accelerometer, for example, such mesas 26 can be utilized to support various stationary comb fingers that drive the moving components 24 of the MEMS device 14, and that sense displacement of the comb fingers resulting from inertial movement of the MEMS device 14 about an input axis. The mesas 26 can also be configured to support a number of suspension springs, which as is described below with respect to FIG. 2, can be utilized to connect the moving components 24 of the MEMS device 14 to the substrate 12.

A pattern of conductive traces 30 formed on the first surface 16 of the substrate 12 can be provided to electrically connect the MEMS device 14 to other external components, if desired. In certain embodiments, the conductive traces 30 can be formed by depositing a patterned layer of gold, platinum, or other suitable metal onto the first surface 16 of the substrate 12, although other techniques may be used, if desired. If desired, and in some embodiments, a metal layer 32 may be deposited on the first side 16 of the substrate 12 adjacent to and underneath the moving components 24 of the MEMS device 14, forming a lower sense plate that can be utilized to sense movement of the moving components 24 toward the substrate 12.

Figure 1B:
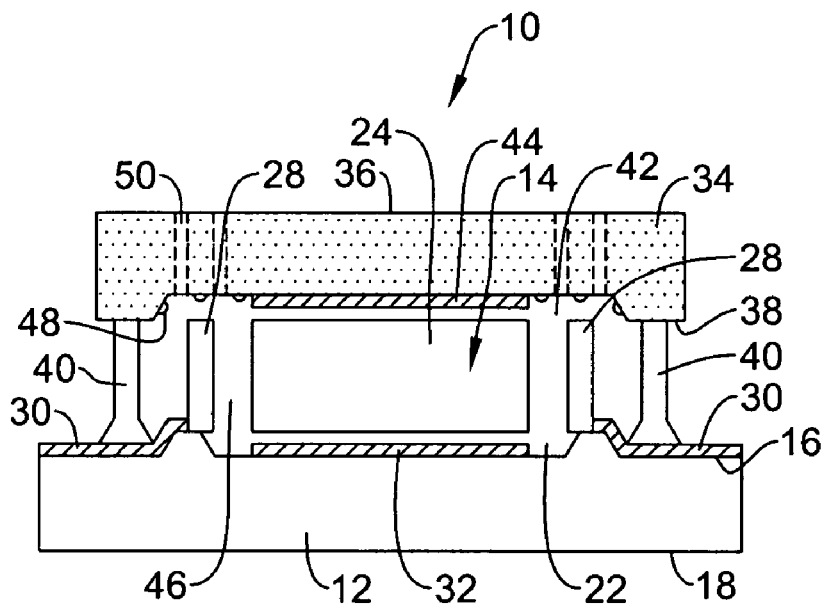

FIG. 1B is a schematic view showing an illustrative step of attaching a cap 34 to the first surface 16 of the substrate 12. As shown in FIG. 1B, the cap 34 may have an outer side 36 and an inner side 38, and may be attached to the first side 16 of the substrate 12 using a sealing ring 40 or other suitable attachment means. As with the substrate 12, the cap 34 may include a recessed cavity 42 equipped with a metal layer 44 for sensing upward displacement of the moving components 24 toward the cap 34. When coupled together, the cap 34 and substrate 12 both form an interior cavity 46 of the structure that can be utilized to protect the MEMS device 14 from chemical and particulate contamination, thermal stresses, and/or mechanical stresses caused by operation of the MEMS device 14, for example, in high-G environments.

The cap 34 can be formed from a wafer of glass, silicon or other suitable material, and can be bonded to the substrate 12 using techniques standard in the art such as thermocompression bonding, soldering or thermoelectric (e.g. anodic) bonding. In an illustrative thermocompression bonding technique, for example, simultaneous heat and pressure can be applied to the substrate 12 and cap 34 causing them to diffuse into each other. Alignment of the two members 12, 34 can be accomplished using a suitable vision system employed in the art, which is common in the fabrication of many flip chip devices. Once aligned and brought together, the substrate 12 and cap 34 can then be inserted into a pressure chamber and heated to an elevated temperature, causing the cap 34 material to thermally fuse into the substrate 12 material. During fabrication, the bonding of the cap 34 to the substrate 12 acts to seal the structure while capturing a controlled atmosphere within the interior cavity 46.

As can be further seen in FIG. 1B, a pattern of getter can be applied to the inner side 38 of the cap 34 to help maintain vacuum within the interior cavity 46 by chemically sorbing contaminants that can result from the outgassing of common atmospheric gasses and packing-material vapors during processing, and/or by the diffusion or microleaking of such materials into the interior cavity 46. As shown in FIG. 1B, the pattern of getter may include, for example, a number of getter dots 48 formed on the inner side 38 of the cap 34. The getter dots 48 can assume any number of suitable shapes and sizes to provide a high active surface area for sorption. Examples of suitable sorbing materials may include, but are not limited to, aluminum, barium, magnesium, tantalum, titanium, thorium, vanadium, or compositions or alloys thereof containing one or more of these or other materials such as Zr—Al—Fe or Zr—V—Fe. The getter dots 48 can be formed by depositing small, encapsulated dots at one or more locations within the interior cavity 46, and then subsequently firing the dots at a later step by applying sufficient heat, applying sufficient current or voltage, and/or using any other suitable getter firing technique. In the illustrative embodiment of FIG. 1B, the getter dots 48 are shown located on the inner side 38 of the recessed portion of the cap 34 adjacent to the underlying MEMS device 14. It should be understood, however, that the getter dots 48 could also be positioned at other locations within the interior cavity 46 such as along the interior portions of the sealing rings 40 and/or on the first side 16 of the substrate 12, if desired.

In some illustrative embodiments, the cap 34 may include a number of openings 50 which extend from the outer surface 36 through the thickness of the cap 34 to the inner surface 38 thereof. The openings 50 can be arranged on the cap 34 in a pattern or array, and can be formed using laser drilling, etching, or other suitable technique. In those embodiments wherein the cap 34 also acts as an upper sense plate for the MEMS device 14, the openings 50 can be positioned towards the periphery of the cap 34 at a location away from the upper metal layer 44. The openings 50 can be sized sufficiently small to prevent particulates, injection molding material, and/or other matter from entering the interior cavity 46 of the capped substrate 12. In certain embodiments, for example, the openings 50 may be micron-sized, having a diameter on the order of only a few microns to prevent impurities located outside of the capped substrate 12 from entering the interior cavity 46 prior to packaging.

Figure 1C:
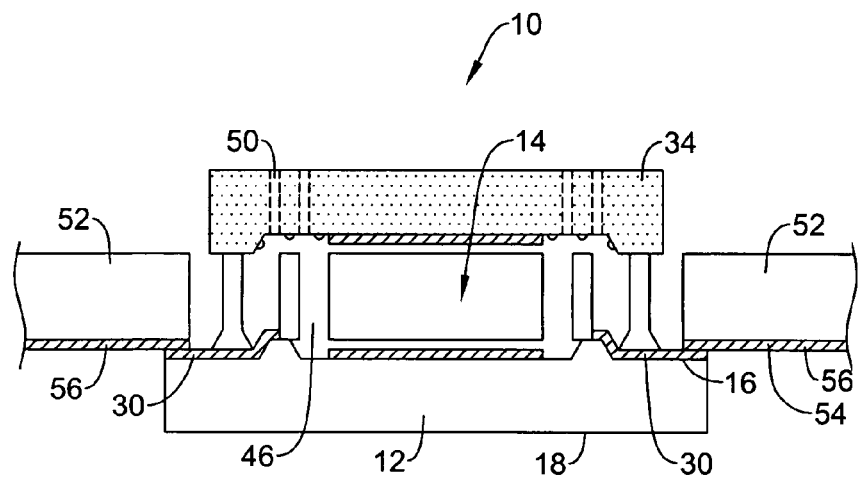

FIG. 1C is a schematic view showing an illustrative step of attaching the capped substrate 12 of FIG. 1B to a lead frame 52. As shown in FIG. 1C, a bonding side 54 of the lead frame 52 can be attached to the first side 16 of the substrate 12 using a suitable bonding technique such as adhesion bonding, thermocompression bonding, RF welding, solder bonding, ultrasonic welding, thermoelectric (e.g. anodic) bonding, etc. The lead frame 52 may include a number of conductive traces 56 adapted to align with the conductive traces 30 coupled to the substrate 12.

Figure 1D:
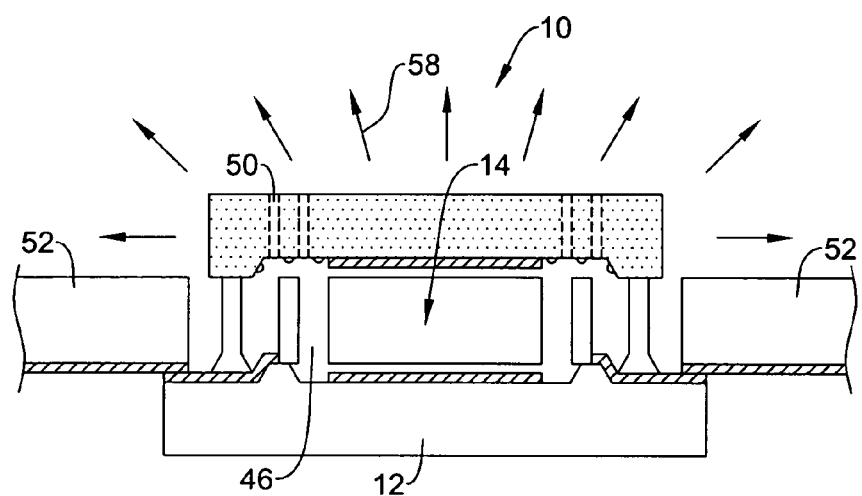
Figure 1E:
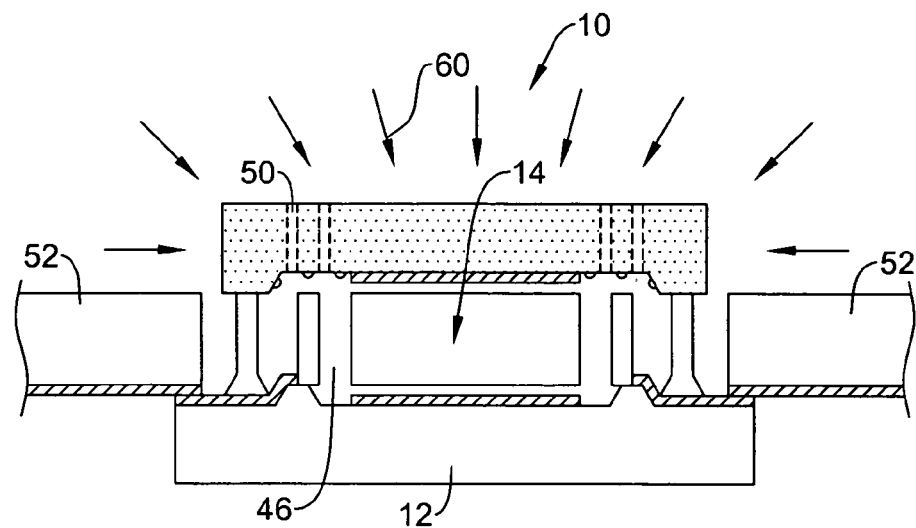

FIG. 1D is a schematic view showing an illustrative step of inserting the capped substrate 12 and lead frame 52 into a vacuum chamber and forming a controlled vacuum pressure within the interior cavity 46. As indicated by outwardly directed arrows 58 in FIG. 1D, a negative pressure can be induced within the vacuum chamber, forcing any gasses and/or other contaminants within the interior cavity 46 to be drawn outwardly through the openings 50, thereby producing a controlled vacuum pressure within the interior cavity 46. Such evacuation of any contaminants within the interior cavity 46 can be accomplished by placing the capped substrate 12 and lead frame 52 within tooling containing a number of vacuum ports. A vacuum pump or other means for providing suction can be configured to produce vacuum or near vacuum pressures within the interior cavity 46. During fabrication, the vacuum pressure produced within the interior cavity 46 reduces many of the impurities that can affect the performance of the MEMS device 14, and, in some cases, can be used as a vacuum reference pressure for the MEMS device 14 for those embodiments wherein the MEMS device 14 includes a pressure sensor or the like.

In those embodiments employing getter within the interior cavity 46, a heating source can be provided within the vacuum chamber to fire the getter, causing it to activate within the interior cavity 46. In certain embodiments, for example, firing of the getter can be accomplished by RF induction heating or laser heating, although other techniques may also be used, if desired. The activation parameters of the getter such as temperature, time and method of heating can be altered depending on the size of the getter, the type of getter material employed, as well as other factors. If desired, the temperature of the getter firing process can be monitored using a thermocouple or other suitable monitoring means to prevent the occurrence of excessive outgassing. Once heated, and while still under vacuum pressure within the vacuum chamber, the activated getter can then be allowed to cool to its test temperature.

In certain embodiments, it may be desirable to inject or backfill reference gasses within the interior cavity 46 to provide a partial pressure reference for certain types of inertial sensor devices. In those embodiments where the MEMS device 14 is an accelerometer, for example, it may be desirable to inject an inert gas such as nitrogen or argon into the interior cavity 46 to provide a partial pressure reference therein that can be used to improve the performance characteristics of the accelerometer. As indicated by the inwardly directed arrows 60 in FIG. 1E, such process of injecting a reference gas into the interior cavity 46 can be accomplished by applying a sufficient positive pressure (e.g. $\geq 1$ atm) about the capped substrate 12 and lead frame 52, and then filling the pressure chamber with the desired gas, causing the gas to seep through the openings 50 and into the interior cavity 46. While pressures at or above 1 atm are typically sufficient to backfill the inert gas within the interior cavity 46, it should be understood that pressures lower than this range could be employed in certain cases.

Figure 1F:
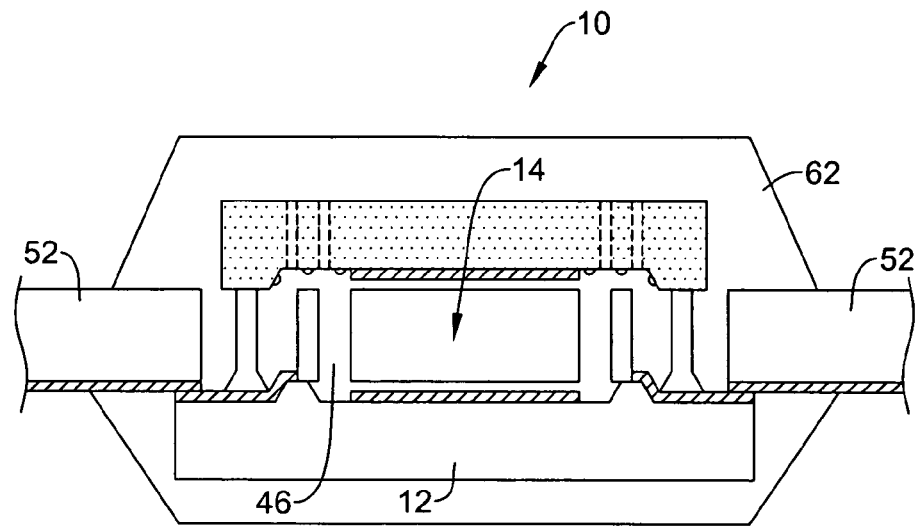

FIG. 1F is a schematic view showing an illustrative step of injection molding a package about the capped substrate 12 and a portion of the lead frame 52. As shown in FIG. 1F, once the desired vacuum or partial pressure is provided within the interior cavity 46, an injection molding process can be performed under vacuum pressure to form a package 62 about the exterior of the capped substrate 12 and a portion of the lead frame 52. The process of injection molding a package 62 about the capped substrate 12 and lead frame 53 under vacuum pressure can act to hermetically seal the MEMS device 14 within the interior cavity 46, thereafter preventing gasses and/or other contaminants from interfering with the operation of the MEMS device 14. The package 62 may further act to counterbalance the effects of thermal and mechanical stresses that can result from operation the device in high temperature, high-G environments or other such environments. Also, by forming the package 62 about the capped substrate 12 and lead frame 52 instead of creating the package as a separate part, an integral vacuum pressure can be created within the interior cavity 46 while obviating the need to perform additional packaging steps that typically result from forming the package as a separate piece.

The package 62 can be molded using traditional plastic injection molding techniques commonly used in the art such as injection compression molding or thin-wall injection molding. Alternatively, and in other embodiments, a process such as metal injection molding (MIM), ceramic injection molding (CIM), or combinations thereof can be utilized to form a package 62 having a metal or ceramic composition. Such MIM and CIM techniques do not typically suffer from the porosity problems endemic in some plastic injection molding techniques, and are thus capable of providing a greater degree of precision while reducing the overall size of the package.

In an illustrative MIM process in accordance with an exemplary embodiment of the present invention, a fine metal powder is compounded with a plastic or water-based binder to create feedstock in preparation for the molding process. Compounding of the metal powder may occur using a suitable process such as cold isostatic pressing (CIP), hot isostatic pressing (HIP), forging, rolling, extrusion, injection molding, and/or pressureless compaction. The determining characteristics of the binder employed will typically depend on factors such as cost, tolerance requirements, and the geometry and/or size of the package. Exemplary binders that can be used may include, but are not limited to, polyolefins such as polyethylene, polypropylene, and ethylene-vinyl acetate copolymer; acryl resins such as polymethyl (meth)acrylate and polybutyl (meth)acrylate; styrene resins such as polystyrene, polyvinylchloride plyvinylidene chloride, polyamide, polyesters, polyether, polyvinyl alcohol, parylene and copolymers thereof. In some embodiments, a plasticizer may be further added to the binder, if desired.

Once the feedstock is created, it can then be injected into the tooling supporting the capped substrate 12 and lead frame 52 to form a "green body" of the package 62. Once formed, the green body is then subjected to a debinding step, wherein the body is thermally treated in a non-oxidizing atmosphere under vacuum or at a reduced pressure in an inert atmosphere of nitrogen or argon gas, typically in the range of about $1 \times 10^{-1}$ to $1 \times 10^{-6}$ Torr.

After molding has occurred, the package can then be debound and sintered at an elevated temperature (e.g. 600° F. to 2,200° F.) to fuse the fine powdered particles into the final shape of the package. Suitable debinding techniques may include, for example, catalytic, thermal and/or solvent debinding. A sintering process wherein the packaging material is heated to a temperature below its melting point but high enough to allow bonding or fusion of the individual particles can then be performed in a sintering furnace or the like. The final shape of the package is then solidified under the vacuum pressure that is applied during the molding process.

In a ceramic injection molding (CIM) process, a similar set of steps can be performed to create a package about the capped substrate 12 and lead frame 52 having a ceramic composition. In a CIM process, however, the sintering process is typically performed at higher temperatures (e.g. 1300° C. to 1700° C. or greater) depending on the type of ceramic material employed, thereby imparting a greater degree of cohesion and density to the package. As with a MIM process, such step typically leads to a controlled shrinkage of the final package based on the material properties of the feedstock employed.

Figure 2:
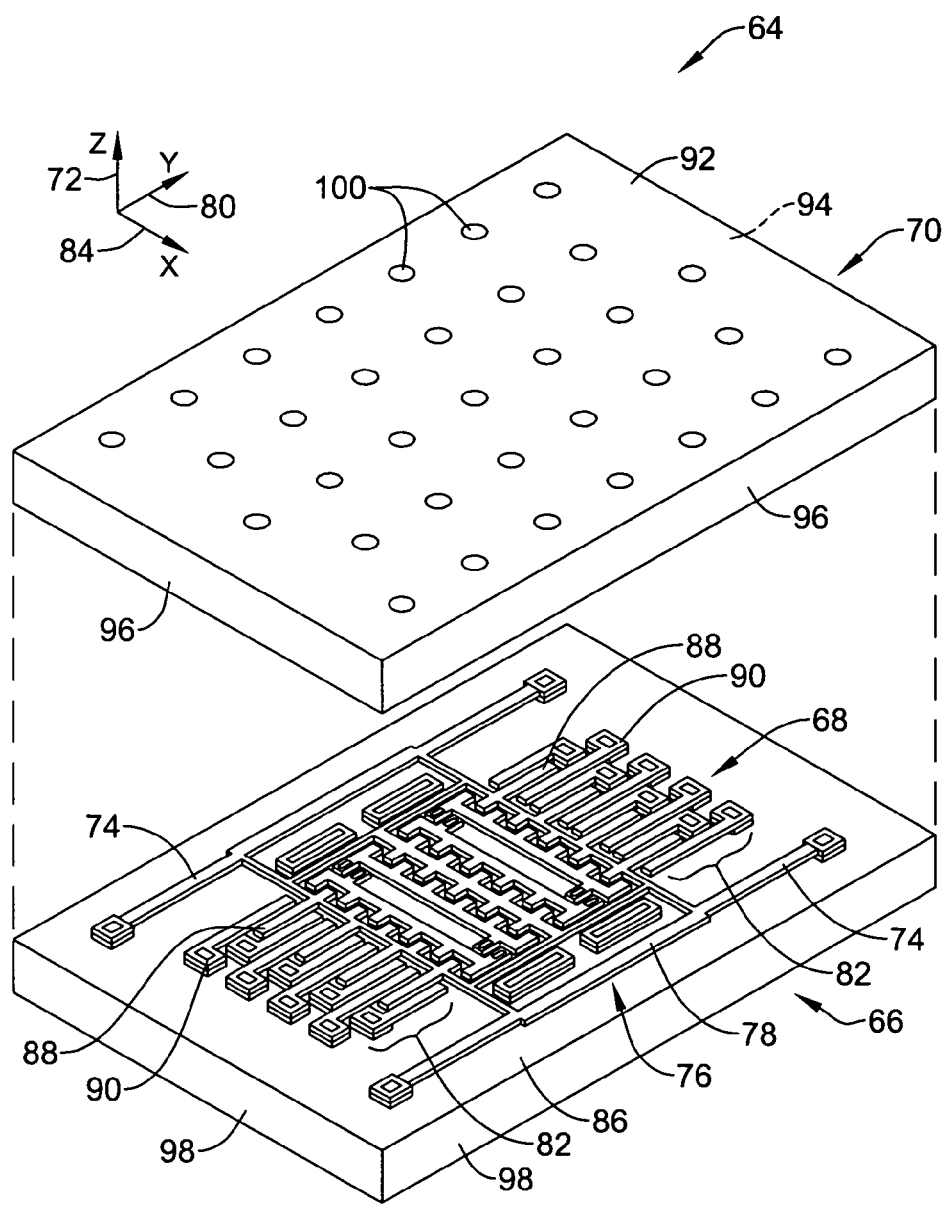
FIG. 2 is an assembly view showing an illustrative MEMS inertial sensor assembly in accordance with an exemplary embodiment of the present invention.

Turning now to FIG. 2, an illustrative MEMS inertial sensor assembly 64 in accordance with an exemplary embodiment of the present invention will now be described. As shown in FIG. 2, MEMS assembly 64 may include a MEMS substrate 66 having an inertial sensor device 68 formed thereon, and a cap 70 that can be utilized to seal the inertial sensor device 68. In the illustrative embodiment of FIG. 2, the inertial sensor 68 comprises a micromachined gyroscope configured to detect and measure inertial motion of an object moving about an input or "rate" axis 72. Sensor 68 may include a suspension system 74, a drive system 76 including an oscillating proof mass 78 adapted to move back and forth along an X-axis 80 of the sensor 68, and a sensing system 82 used both to detect deflections of the proof mass 78 along a Y-axis 84 of the inertial sensor 68, and to apply electrostatic forces for canceling any quadrature error within the drive and/or sensing systems 76,82.

The suspension system 74 can be configured to support the proof mass 78 in a manner to permit vibration of the proof mass 78 in a plane substantially parallel to a top surface 86 of the substrate 66. Typically, the suspension system 74 supports the proof mass 78 a distance above the top surface 86 to permit the proof mass 78 to freely move relative to the sensing system 82, which remains stationary above the top surface 86. Formation of the various structures, including the suspension system 74 and the oscillatory proof mass 78 can be accomplished, for example, by etching or grinding cavities within the top surface 86 having predetermined dimensions whose locations correspond to the desired components on the substrate 66. During operation, a set of electrostatic sense comb fingers 88 interdigitated with a corresponding set of stationary electrode fingers 90 of the sensing system 82 can be configured to sense slight movements of the proof mass 78 along the Y-axis 84 as a result of Coriolis forces exerted on the proof mass 78 as the structure rotates about the Z-axis 72.

The cap 70 can be dimensioned to attach to the substrate 66 so as encapsulate or partially encapsulate the inertial sensor 68 without affecting the ability of the suspension system 82 and drive system 76 to freely move in all directions. The cap 70 may include a cap wafer having an outer side 92, an inner side 94 (hidden), and a number of sidewalls 96 that can be aligned with and secured to a number of peripheral walls 98 of the substrate 66. In an alternative embodiment, the cap 70 can be secured to the substrate 66 using a sealing ring similar to that described above with respect to FIG. 1, if desired.

As can be further seen in FIG. 2. the cap 70 may include a number of openings 100 which extend from the outer side 92 through, the thickness of the cap 70 to the inner side 94 thereof. The openings 100 can be arranged on the cap 70 in a pattern or array, and can be formed using laser drilling, etching, or other suitable technique. The openings 100 can be sized sufficiently small to prevent particulates, injection molding material, and/or other matter from entering the interior of the capped substrate 66 during the fabrication process.

As with the openings 50 described above with respect to FIGS. 1B-1F, the openings 100 can be utilized for creating a controlled vacuum pressure and/or partial pressure adjacent the inertial sensor 68, in certain embodiments, the openings 100 may be disposed on only the outer periphery of the cap 70, allowing an upper sense plate or other such structure to be formed on the inner side 94 of the cap 70 adjacent to the inertial sensor 68.

Figure 3A:
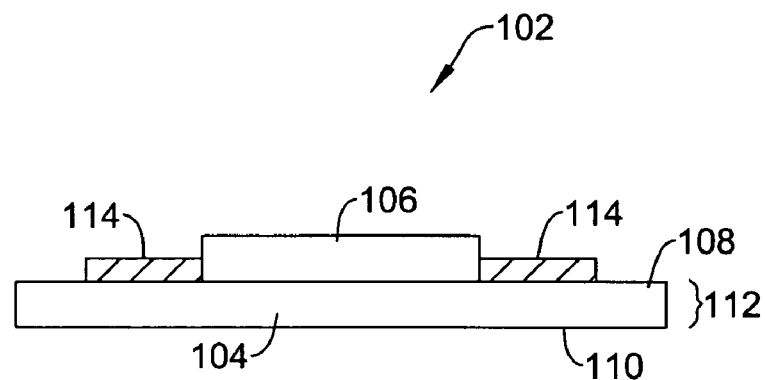
FIGS. 3A-3F are schematic views showing an illustrative method of packaging a MEMS inertial sensor in accordance with an exemplary embodiment of the present invention.

Referring now to FIGS. 3A-3F, an illustrative method of packaging a MEMS inertial sensor similar to that depicted in FIG. 2 will now be described. The method, represented generally by reference number 102 may begin in FIG. 3A with the step of providing a substrate 104 having an inertial sensor 106 formed thereon. As shown in FIG. 3A, the processed substrate 104 may have a first side 108, a second side 110, and a thickness 112 extending between the first and second sides 108,110. The inertial sensor 106, in turn, may extend upwardly from the first side 108 of the substrate 104 and/or may be inset within a recessed cavity etched on the first side 108 of the substrate 104. As with the illustrative method of FIGS. 1A-1F, a pattern of conductive traces 114 formed on the first side 108 of the substrate 104 can be utilized to electrically connect the inertial sensor 106 to other external components, if desired.

Figure 3B:
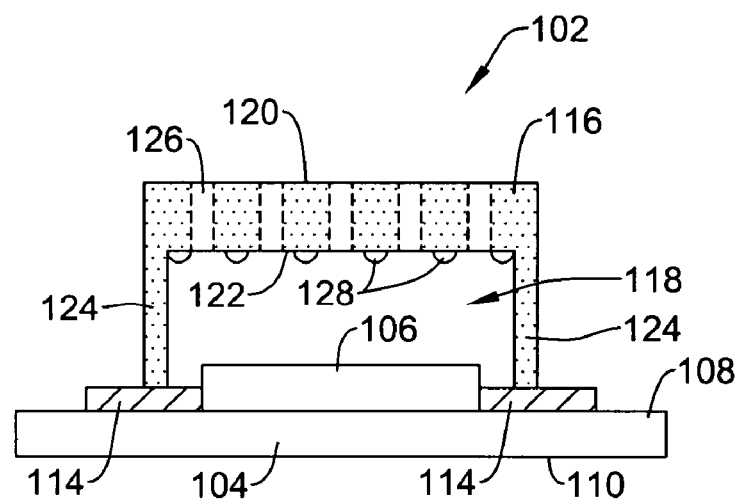

FIG. 3B is a schematic view showing an illustrative step of attaching a cap 116 to the first side 108 of the substrate 104. As with other embodiments, the cap 116 may include, for example, a dust cap and/or upper sense plate of the inertial sensor 106, and can be utilized to encapsulate or partially encapsulate the inertial sensor 106 within an interior cavity 118 formed by the substrate 104 and cap 116. The cap 116 may have an outer side 120, an inner side 122, and a number of sidewalls 124 that can be attached to the first side 108 of the substrate 104. Attachment of the cap 116 can be accomplished in a manner similar to that described above with respect to FIG. 1B, using a suitable process such as thermoelectric (e.g. anodic) or thermocompression bonding.

The cap 116 may further include a number of micron-sized openings 126 which extend from the outer side 120 through the thickness of the cap 116 to the inner side 122 thereof. As described above, the openings 126 can be sized sufficiently small to prevent particulates, injection molding material, and/or other matter from entering the interior cavity 118 of the capped substrate 104 during fabrication. If desired, a pattern of getter dots 128 can be applied to select portions of the cap 116 and/or substrate 104 to chemically sorb contaminants contained within the interior cavity 118.

Figure 3C:
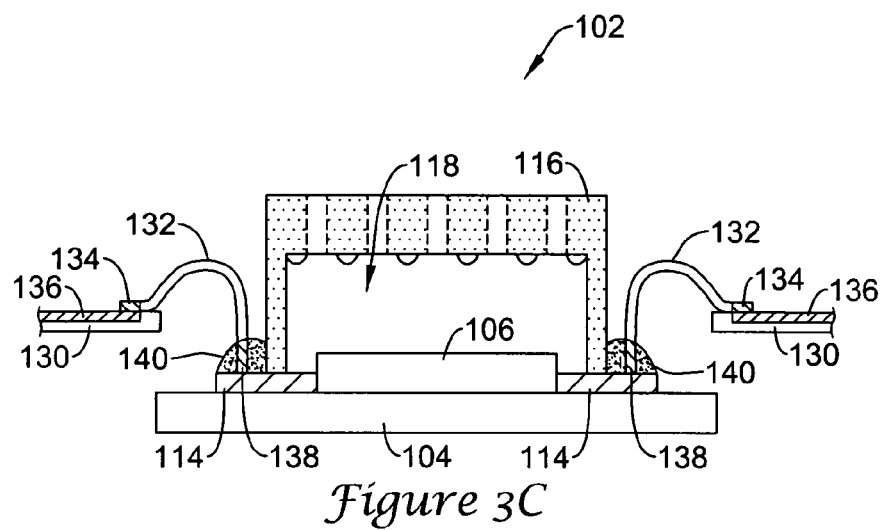

FIG. 3C is a schematic view showing an illustrative step of attaching the capped substrate 104 of FIG. 3B to a lead frame 130. As shown in FIG. 3C, a number of wire bonds 132 can be connected at a first end 134 to conductive traces 136 formed on the lead frame 130, and at a second end 138 thereof to contact pads 140 formed on the conductive traces 114. In certain embodiments, the wire bonds 132 can be bonded to the conductive traces 136 and contact pads 140 using a suitable soldering process and a solder material such as gold or platinum. While the illustrative lead frame 130 of FIG. 3C is shown attached to the capped substrate 104 using several wire bonds 132, it should be understood that other attachment techniques could be employed. In certain alternative embodiments, for example, the lead frame 130 can be attached to the capped substrate 104 using a bonding process such as adhesion bonding, thermocompression bonding, RF welding, solder bonding, ultrasonic welding, thermoelectric (e.g. anodic) bonding, etc.

Figure 3D:
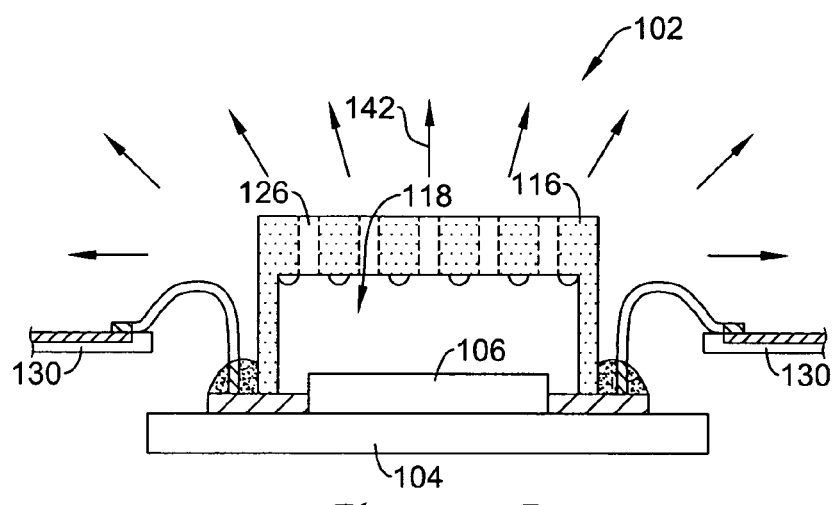
Figure 3E:
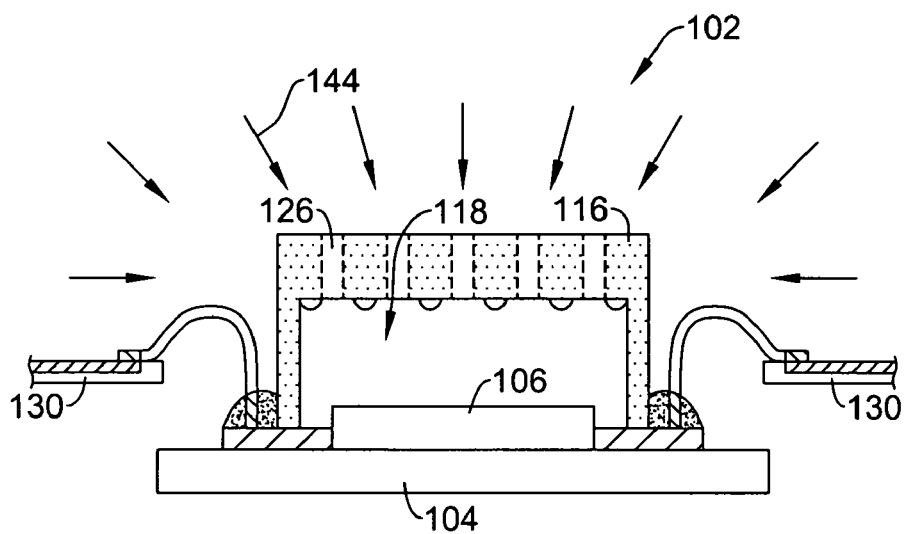
Figure 3F:
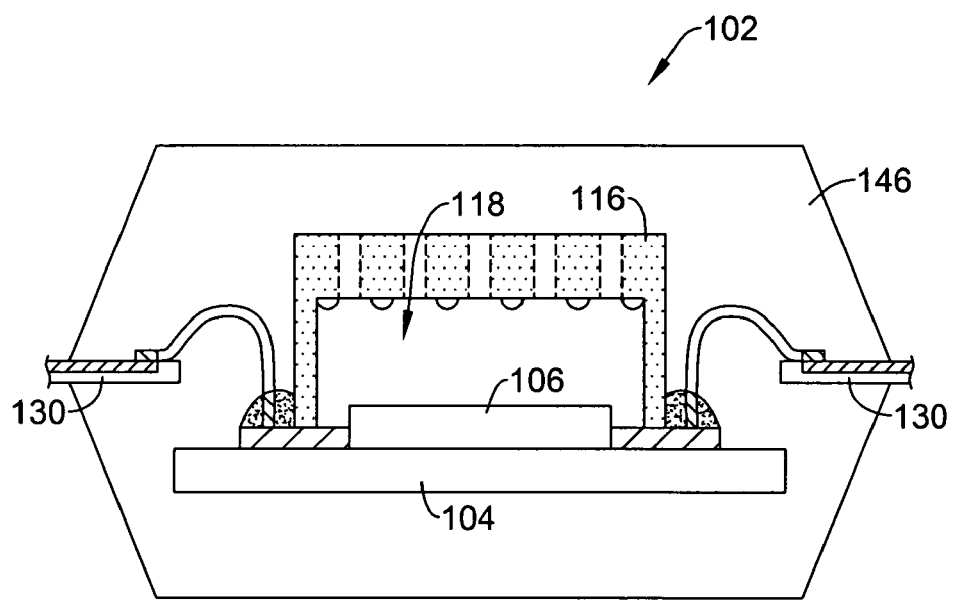

FIGS. 3D-3F are schematic views showing the illustrative steps of inserting the capped substrate 104 and lead frame 130 into a vacuum chamber and injection molding a package about the structure. As indicated by outwardly directed arrows 142 in FIG. 3D, for example, a negative pressure can be induced within the vacuum chamber, forcing any gasses and/or other contaminants within the interior cavity 118 to be drawn outwardly through the openings 126, thereby producing a controlled vacuum pressure within the interior cavity 118. Any getter deposited onto the interior surfaces of the cap 116 can also be fired at this step, providing activated getter within the interior cavity 118, if desired.

In a subsequent step illustrated in FIG. 3E, and as indicated generally by reference to the inwardly directed arrows 144, the vacuum chamber can be subjected to a positive pressure and filled with an inert gas such as nitrogen or argon, causing the gas within the pressure chamber to seep through the openings 126 and into the interior cavity 118. A subsequent injection-molding step illustrated in FIG. 3F can then be performed to create a package 146 about the capped substrate 104 and a portion of the lead frame 130, similar to that described above with respect to FIG. 1F. In certain embodiments, for example, a plastic injection molding process such as injection compression molding or thin-wall injection molding can be utilized to form a package 146 having a plastic composition. In other embodiments, a MIM or CIM process can be utilized to form a package 146 having a metal or ceramic composition, respectively.

Having thus described the several embodiments of the present invention, those of skill in the art will readily appreciate that other embodiments may be made and used which fall within the scope of the claims attached hereto. Numerous advantages of the invention covered by this document have been set forth in the foregoing description. It will be understood that this disclosure is, in many respects, only illustrative. Changes may be made in details, particularly in matters of shape, size and arrangement of parts without exceeding the scope of the invention.

What is claimed is:

1. A method of packaging a MEMS device, comprising the steps of:
    providing a substrate having an inertial sensor, provided therein or thereon;
        providing a cap, having a number of openings formed through the cap;
        attaching the cap to the substrate and sealing the inertial sensor within an interior cavity at least partially formed by the cap and substrate, wherein the cap openings provide a passageway to the interior cavity;
        inserting the capped substrate into a vacuum chamber and evacuating gasses and/or contaminants contained within the interior cavity out through the cap openings to form a reduced pressure or vacuum-filled reference cavity therein;
        injection molding a package about the capped substrate while under a reduced or vacuum pressure within said vacuum chamber; and
        providing a lead frame including one or more conductive leads; and attaching the capped substrate to the lead frame and electrically connecting the inertial sensor to the one or more conductive leads,
        wherein attaching the capped substrate to the lead frame is performed prior to inserting the capped substrate into the vacuum chamber and evacuating gasses and/or contaminants contained within the interior cavity.

2. The method of claim 1, wherein said step of inserting the capped substrate into a vacuum chamber and evacuating gasses and/or contaminants contained therein includes the step of applying a negative vacuum pressure to the capped substrate and drawing the gasses and/or contaminants out of the interior cavity through the cap openings.

3. The method of claim 1, further including the step of depositing getter material onto the cap prior to said step of attaching the cap to the substrate.

4. The method of claim 3, further including the step of firing the getter after said step of inserting the capped substrate into the vacuum chamber and evacuating gasses and/or contaminants contained within the interior cavity.

5. The method of claim 1, wherein said step of attaching the capped substrate to the lead frame is accomplished using a number of wire bonds.

6. The method of claim 1, wherein said step of attaching the capped substrate to the lead frame is accomplished using a thermo compression bonding technique.

7. The method of claim 1, further including the step of injecting an inert gas into the interior cavity and forming a partial pressure therein.

8. The method of claim 7, wherein said step of injecting an inert gas into the interior cavity and forming a partial pressure therein is performed after said step of evacuating gasses and/or contaminants contained within the interior cavity.

9. The method of claim 1, wherein said step of injection molding a package about the capped substrate is accomplished using a metal injection molding process.

10. The method of claim 1, wherein said step of injection molding a package about the capped substrate is accomplished using a ceramic injection molding process.

11. The method of claim 1, wherein said step of injection molding a package about the capped substrate is accomplished using a plastic injection molding process.

12. The method of claim 1, wherein said inertial sensor is a MEMS gyroscope.

13. The method of claim 1, wherein said inertial sensor is a MEMS accelerometer.

14. A method of packaging a device, comprising the steps of:
    providing a substrate having a device provided therein or thereon;
    providing a cap having a number of openings formed through the cap;
    attaching the cap to the substrate and sealing the device within an interior cavity at least partially formed by the cap and substrate, wherein the cap openings provide a passageway to the interior cavity;
    inserting the capped substrate into a vacuum chamber and drawing gasses and/or contaminants contained within the interior cavity out through the cap openings to form a controlled vacuum pressure within the interior cavity; and
    injection molding a package about the capped substrate; and
    injecting an inert gas into the interior cavity and forming a partial pressure therein,
    wherein injecting an inert gas into the interior cavity and forming a partial pressure therein is performed after drawing gasses and/or contaminants contained within the interior cavity out through the openings.

15. The method of claim 14, further including the step of depositing getter material onto the cap prior to said step of attaching the cap to the substrate.

16. The method of claim 15, further including the step of firing the getter after said step of inserting the capped substrate into the vacuum chamber and evacuating gasses and/or contaminants contained within the interior cavity.

17. The method of claim 14, further including the steps of:
providing a lead frame including one or more conductive leads; and
attaching the capped substrate to the lead frame and electrically connecting the device to the one or more conductive leads.

18. The method of claim 17, wherein said step of attaching the capped substrate to the lead frame is performed prior to said step of inserting the capped substrate into the vacuum chamber and evacuating gasses and/or contaminants contained within the interior cavity.

19. The method of claim 17, wherein said step of attaching the capped substrate to the lead frame is accomplished using a number of wire bonds.

20. The method of claim 17, wherein said step of attaching the capped substrate to the lead frame is accomplished using a thermo compression bonding technique.

21. The method of claim 14, wherein said step of injection molding a package about the capped substrate is accomplished using a metal injection molding process.

22. The method of claim 14, wherein said step of injection molding a package about the capped substrate is accomplished using a ceramic injection molding process.

23. The method of claim 14, wherein said step of injection molding a package about the capped substrate is accomplished using a plastic injection molding process.

24. The method of claim 14, wherein said device is an inertial sensor.

25. The method of claim 24, wherein said inertial sensor is a MEMS accelerometer or a MEMS gyroscope.

* * * * *